United States Patent
Namba

(10) Patent No.: US 6,990,704 B2
(45) Date of Patent: Jan. 31, 2006

(54) SUBSTRATE CLEANING APPARATUS AND SUBSTRATE CLEANING METHOD

(75) Inventor: Kazuyoshi Namba, Fuchu (JP)

(73) Assignee: Tokyo Electron Limited, Tokyo-To (JP)

( * ) Notice: Subject to any disclaimer, the term of this patent is extended or adjusted under 35 U.S.C. 154(b) by 461 days.

(21) Appl. No.: 09/940,855

(22) Filed: Aug. 29, 2001

(65) Prior Publication Data

US 2002/0092544 A1 Jul. 18, 2002

(30) Foreign Application Priority Data

Aug. 29, 2000 (JP) .......................... 2000-259336

(51) Int. Cl.
*B08B 1/04* (2006.01)

(52) U.S. Cl. .................... 15/77; 15/4; 15/88.2; 15/102; 134/902

(58) Field of Classification Search ............. 15/4, 15/77, 88.2, 102; 134/184, 902
See application file for complete search history.

(56) References Cited

U.S. PATENT DOCUMENTS

| | | | | |
|---|---|---|---|---|
| 5,647,083 A | * | 7/1997 | Sugimoto et al. | 15/77 |
| 5,870,793 A | * | 2/1999 | Choffat et al. | 15/102 |
| 5,911,257 A | * | 6/1999 | Morikawa et al. | 15/88.2 |
| 5,947,134 A | * | 9/1999 | Kim et al. | 134/902 X |
| 6,158,075 A | * | 12/2000 | Tanaka et al. | 15/102 |
| 6,286,525 B1 | | 9/2001 | Nishimura et al. | 134/95.3 |
| 6,543,079 B1 | * | 4/2003 | Yeo | 15/77 |

* cited by examiner

*Primary Examiner*—Mark Spisich
(74) *Attorney, Agent, or Firm*—Smith, Gambrell & Russell, LLP

(57) ABSTRACT

In order to perform scrub cleaning of a substrate, two different scrub heads 31 and 32 are employed. The scrub head 31 is superior to the scrub head 32 in terms of a capability of removing contamination. The scrub head 32 has a low level of adhesion to the contamination as compared with the scrub head 31. The scrub heads 31 and 32 are moved such that the scrub head 32 follows the scrub head 31. Consequently, it is possible to clean the substrate without re-applying contamination, which has been once removed from a surface of the substrate, to the surface of the substrate again.

13 Claims, 9 Drawing Sheets

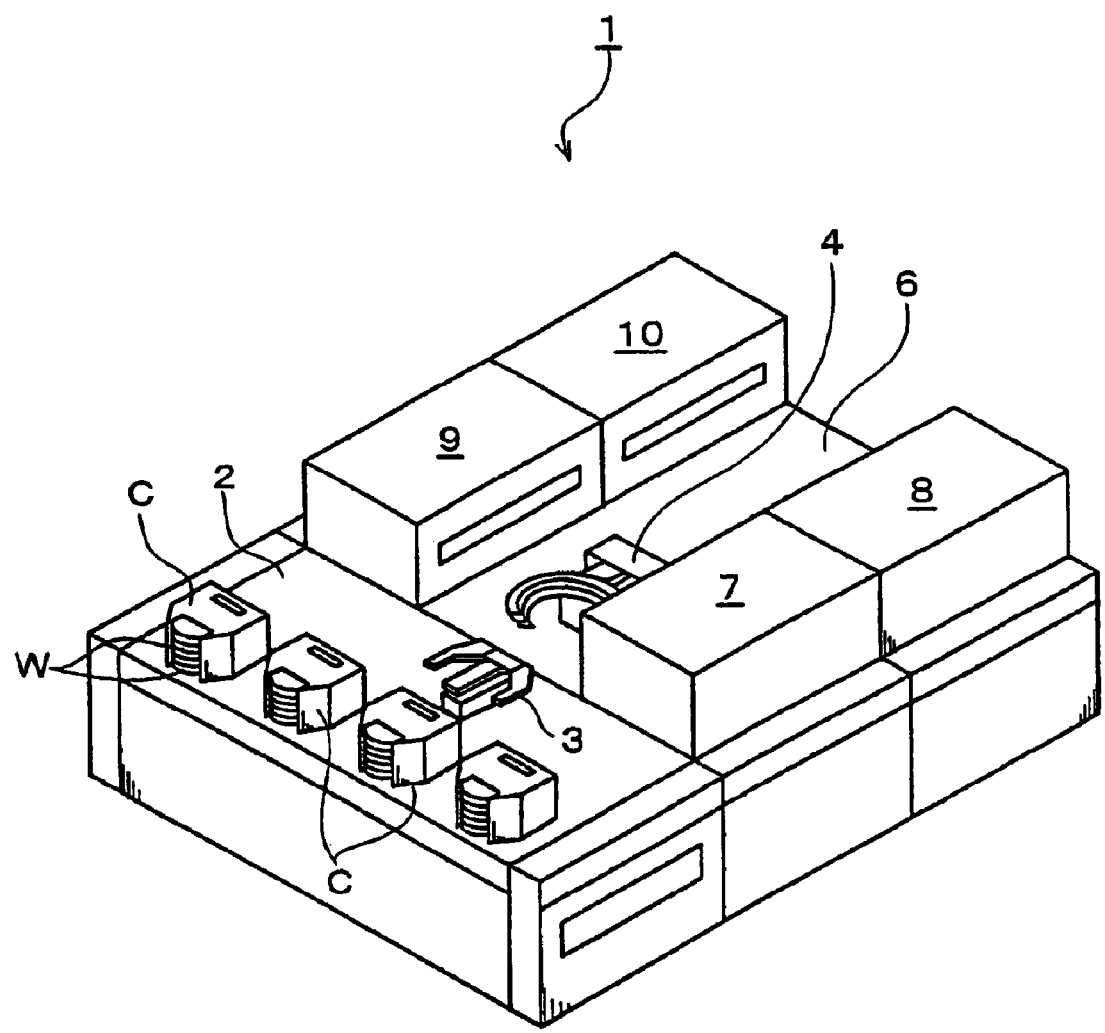
F I G. 1

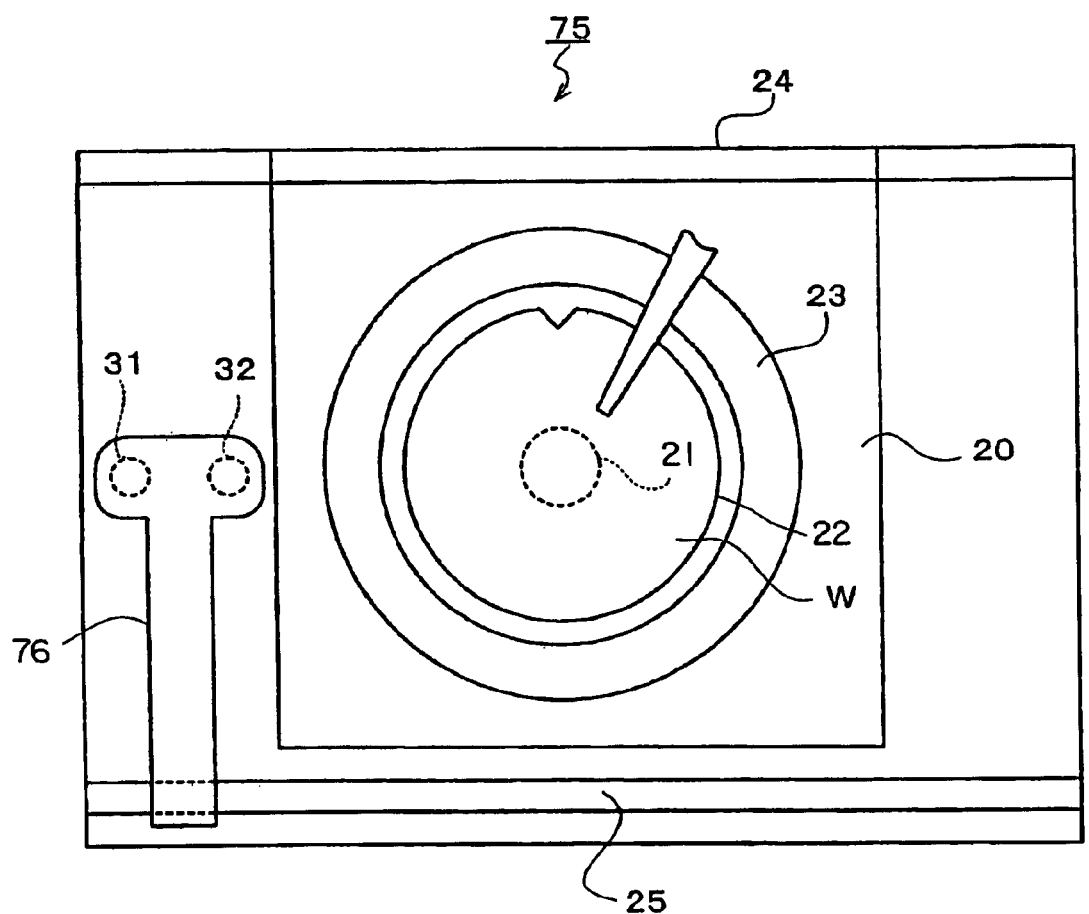
F I G. 13

SUBSTRATE CLEANING APPARATUS AND SUBSTRATE CLEANING METHOD

BACKGROUND OF THE INVENTION

1. Technical Field of the Invention

This invention relates to a method and an apparatus for removing contamination adhered to the surface of a substrate, such as a semiconductor wafer or a LCD substrate.

2. Description of the Related Art

In manufacturing semiconductor devices, there is a need to improve the degree of cleanliness of the surface of the semiconductor wafer that comprises the semiconductor device. To this end, the wafer surface is cleansed before and after each process is carried out. Particularly, as cleansing prior to conducting the photolithography process is vital, particles and other contamination adhering to the surface of the wafer are removed via scrub cleaning. Scrub cleaning is carried out by supplying a cleansing solution to the surface of the revolving wafer, and simultaneously causing a revolving brush to contact the wafer, moving it from the center to the outer edge of the wafer surface.

In recent years, the size of wafers has been increasing. When cleansing such a larger wafer, moving a single brush repeatedly across the surface does not improve the cleansing efficiency, and lengthens the amount of time required for the cleansing process.

With the cleansing apparatus disclosed in Japanese patent laid open publication No. 10-308370A, in order to increase throughput, two identical scrub brushes are used to cleanse the wafer surface. However, when cleansing is carried out by having two identical brushes contact the wafer surface, contamination removed by one of the brushes sometimes adhere to the other brush, and are thus re-applied to the wafer surface (we call this phenomenon "particle-transfer"). As a result, in order to remove the re-applied contamination, the cleansing operation must be carried out repetitively. Due to this, not only is the amount of time required for the cleansing process increased, the wafer surface may be damaged due to excessive cleansing. Furthermore, in order to restore the functionality of the brushes, they themselves must be cleansed for a considerable amount of time after each usage (cleansing of the wafer surface). In addition, if the cleansing process time is lengthy, deterioration of the brushes, such as wear and tear, deformity, etc., will progress and the frequency of having to stop operation of the apparatus in order to replace the brushes will therefore increase.

SUMMARY OF THE INVENTION

Accordingly, the object of the present invention is to prevent the contamination, which have been once removed from the surface of the substrate, from adhering to the same surface again.

In order to attain the above objective, the present invention is characterized in that the first and second scrub heads, namely two cleaning tools, which are different from each other in material, structure or operative manner, cooperate with each other in order to clean the substrate.

The relationships between the first and second scrub heads may be as follows:

(1) The first scrub head is superior to the second scrub head in terms of a capability of removing contamination adhering to a surface of the substrate, and the second scrub head has an lower level of adhesion to the contamination than that of the first scrub head.

(2) The first scrub head has a brush or a sponge for removing contamination from the surface of the substrate. The second scrub head has a internal space to be supplied with a cleaning liquid, and the surface of the second scrub head is formed of a porous material having a number of pores for discharging the cleaning liquid supplied into the space.

(3) The first scrub head is maintained at a height where the first scrub head substantially contacts with the substrate during a cleaning operation. The second scrub head is maintained at a height where the second scrub head contacts with the substrate via a film of the cleaning liquid formed on the substrate, during the cleaning operation.

(4) The first scrub head moves while rotating, and the second scrub head moves but does not rotates.

Advantageously, the first and second scrub heads are moved so that the second scrub head follows the first scrub head.

Advantageously, the substrate rotates during the cleaning process. In such a case, preferably, the first and second scrub heads move from the center of the substrate toward the periphery. In such a case, preferably, the velocities of the first and second scrub heads are gradually decreased as they approach the periphery of the substrate. In addition, preferably, the rotational speed of the substrate is gradually decreased as the first and second scrub heads approach the periphery of the substrate.

BRIEF DESCRIPTION OF THE DRAWINGS

FIG. 1 is a perspective view of a cleaning system, in which a substrate cleaning apparatus according to the present invention is incorporated;

FIG. 13 is a cross-sectional view of a substrate cleaning apparatus, which is another embodiment of the present invention.

DESCRIPTION OF THE PREFERRED EMBODIMENTS

Figure 2:
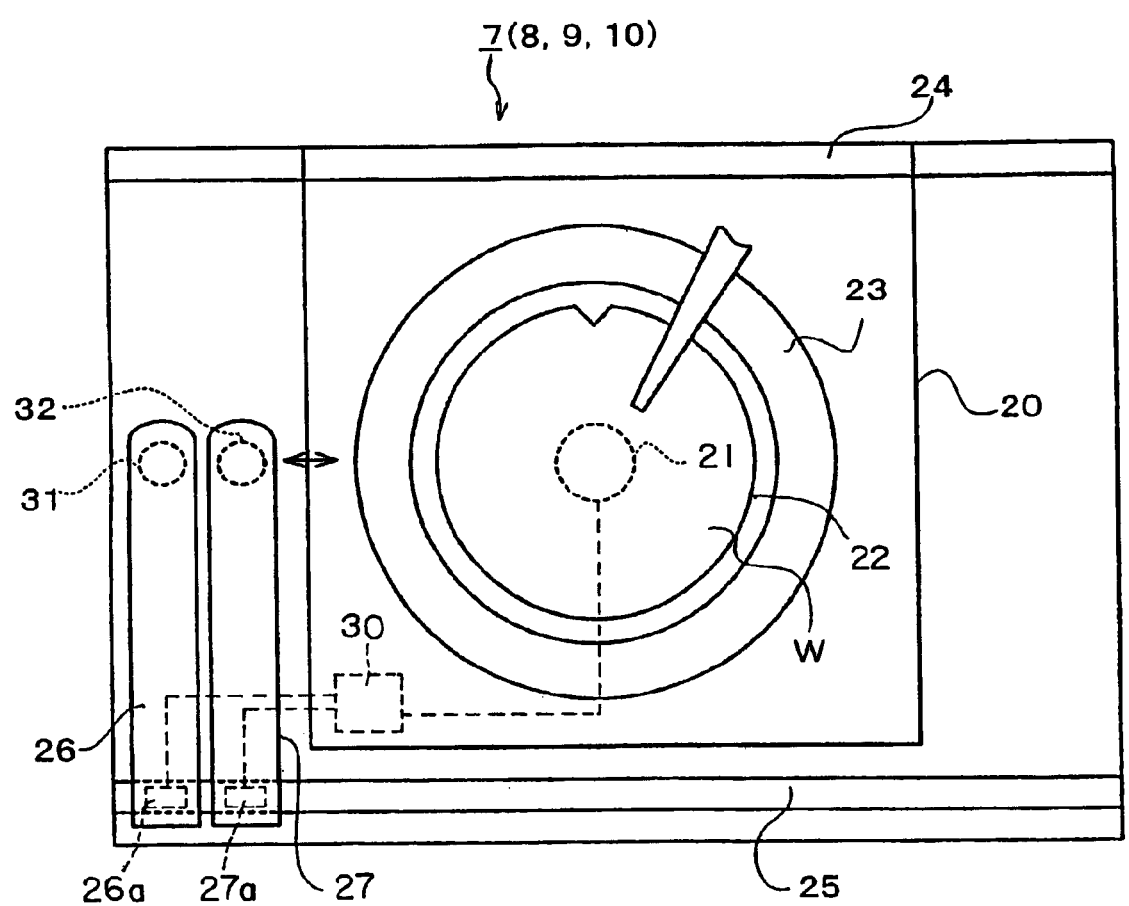
FIG. 2 is a top plan view of a cleaning apparatus, which is an embodiment of the present invention.

With reference to attached drawings, embodiments of the present invention will be described below. FIG. 1 is a perspective view of cleaning system 1 equipped with substrate cleaning apparatuses 7, 8, 9 and 10, each of which is an embodiment of the present invention. A carrier C containing a plurality of wafers W is transferred into the cleaning system 1. In the cleaning system 1, wafers W are removed one by one from the carrier C, are cleaned and dried, and returned to the carrier C.

Provided at the end portion of the cleaning system 1 is a platform 2 (carrier mounting section), on which four carriers C can be placed. Provided at platform 2 is a loading/unloading arm 3, which accommodates and removes wafers W one by one to and from the carrier C. The arm 3 is capable of moving in a direction in which carriers C are arranged on the platform 2, and also capable of moving in a direction in which the arm 3 moves towards and withdraws from the carrier C.

A transfer passageway 6 is provided at a central part of the cleaning system 1. A transfer arm 4 movable along the transfer passageway 6 is arranged in the transfer passageway 6. The substrate cleaning apparatuses 7, 8, 9 and 10 are arranged on both sides of the transfer passageway 6. The transfer arm 4 is capable of removing a wafer W from and delivering a wafer W to each of the substrate cleaning apparatuses 7, 8, 9 and 10. The transfer arm 4 is capable of transferring wafers W, one by one, to and from the loading/unloading arm 3.

Figure 3:
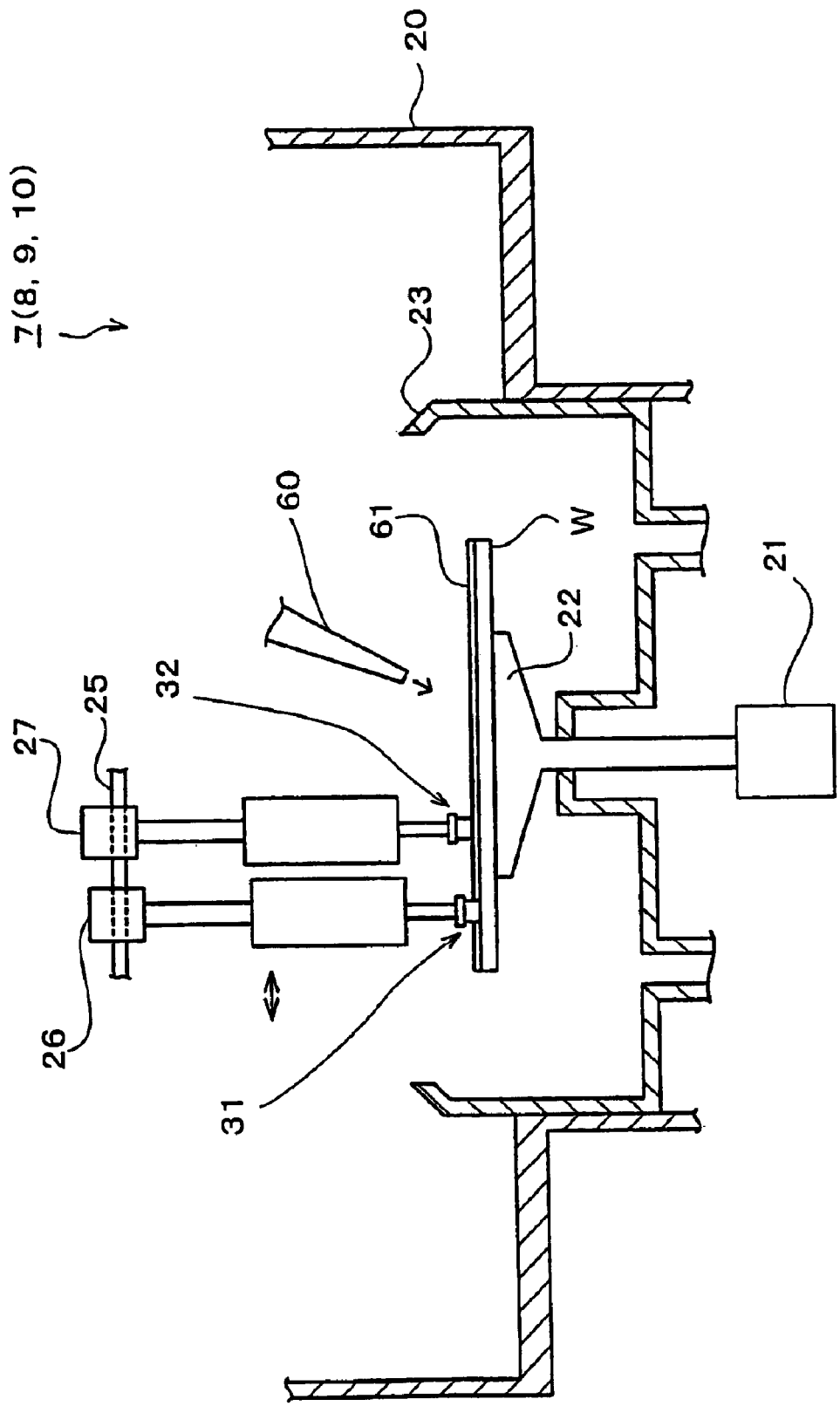
FIG. 3 is a vertical cross-sectional view of the substrate cleaning apparatus shown in FIG. 2.

Next, the substrate cleaning apparatuses 7, 8, 9 and 10 are described. The apparatuses 7 thru 10 are the same in structure, thus only an explanation of the apparatus 7 is provided. FIGS. 2 and 3 are a top plan view and a vertical cross-sectional view of substrate cleaning apparatus 7, respectively.

The substrate cleaning apparatus 7 has a casing 20. Provided at about the center of the casing 20 is a spin chuck 22, which holds a wafer W horizontally by suction. The spin chuck 22 rotates by means of a motor 21. Provided around the spin chuck 22 is a cup 23, which prevents cleaning liquid applied to the surface of the wafer W from scattering.

A shutter 24 is provided in front of the casing 20 (with the cleaning system 1 shown in FIG. 1, a side of the casing 20 facing the transfer passageway 6). The shutter 24 opens when a wafer W is delivered to and removed from the substrate cleaning apparatus 7, and closes when the cleaning process is carried out in the apparatus 7.

A guide rail 25 is arranged at the opposite side of the shutter 24. Proximal ends of a first arm 26 and a second arm 27 are fixed to the guide rail 25. Actuators 26a and 27a are provided at the proximal ends of the first and second arms 26 and 27, respectively. Upon operation of the actuators 26a and 27a, the first and second arms 27 move along the guide rail 25. Moving velocities of the first arm 26 and second arm 27 can be varied independently. FIG. 2 shows the first and second arms 26 and 27 when they are positioned at stand-by positions beside the cup 23. FIG. 3 shows the first and second arms 26 and 27 when they are positioned above the cup 23 and cleaning the wafer W.

As shown in FIGS. 2 and 3, the substrate cleaning apparatus 7 is provided with a nozzle 60, which is capable of moving above the cup 23. The nozzle 60 is capable of feeding cleaning liquid, such as pure water, onto the surface of the wafer W.

Figure 4:
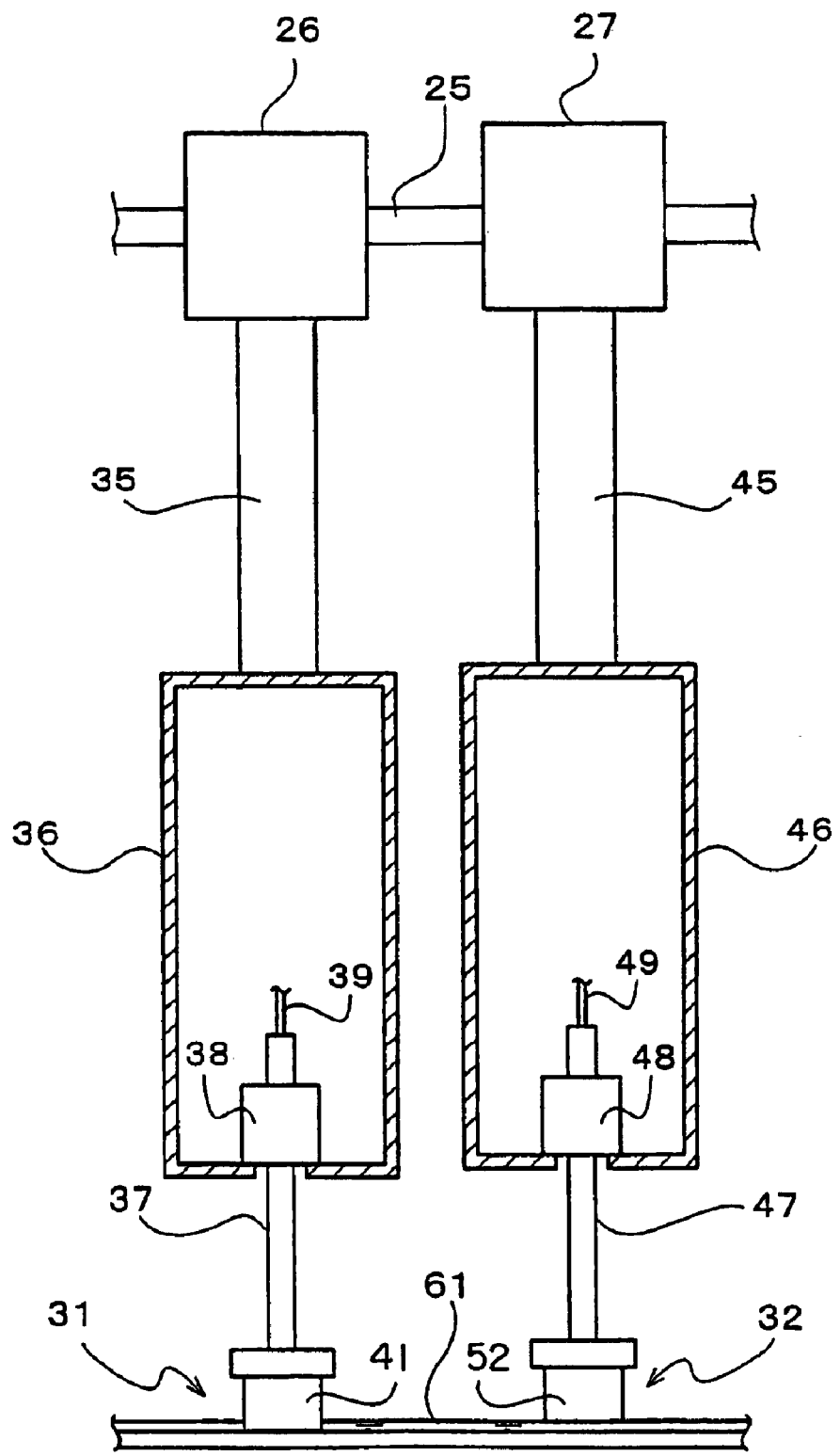
FIG. 4 is an illustration showing the structure of the scrub heads shown in FIGS. 2 and 3.

As shown in FIG. 4, a first driving device 36 is fixed to the bottom face of the tip of the first arm 26 via a supporting bar 35. The first driving device 36 has a raising/descending and rotating shaft 37 projecting downward and a raising/descending and rotating mechanism 38 that moves the shaft 37 vertically and also rotates the shaft 37. A first scrub head 31 is attached to the lower end of the shaft 37. Thus, the first scrub head 31 is capable of vertical movement and rotation. The mechanism 38 is capable of adjusting the vertical position of the first scrub head 31 and the contact pressure of the first scrub head 31 against the wafer W. A cleaning liquid feeding passage 39 is passed through the center of the shaft 37 for supplying cleaning liquid, such as pure water.

As shown in FIG. 4, a second driving device 46 is fixed to the bottom face of the tip of the second arm 27 via a supporting bar 45. The second driving device 46 has a raising/descending shaft 47 projecting downward and a raising/descending mechanism 48 that moves the shaft 47 vertically. A second scrub head 32 is fixed to the bottom end of the shaft 47. Thus, the second scrub head 32 is capable of vertical movement. A cleaning liquid feeding passage 49 is passed through the center of the shaft 47 for supplying cleaning liquid, such as pure water. An ultrasonic oscillator 53 is arranged in the passage 49. Thereby, ultrasonic vibration is applied to pure water which will flow out from the second scrub head 32. Alternatively, the raising/descending mechanism 48 may be replaced with the raising/descending and rotating mechanism 38 so that the second scrub head 32 is capable of rotation.

Figure 5:
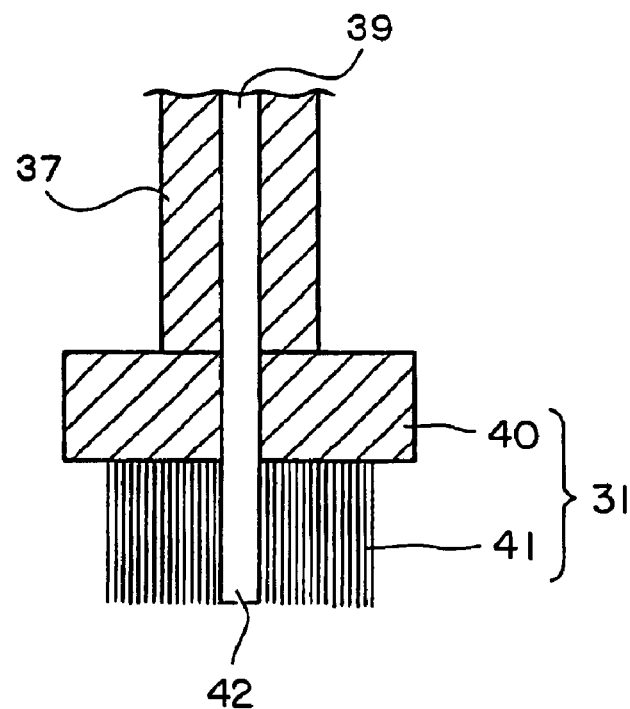
FIG. 5 is an enlarged cross sectional view of the first scrub head.

As shown in FIG. 5, the first scrub head 31 consists of a base 40 and a brush 41 studded in the base 40. The brush 41 has a cylindrical form in general. A passage 42 is formed at the center of the first scrub head 31. The cleaning liquid supplied through the cleaning liquid feeding passage 39 in the shaft 37 is discharged from the bottom of the first scrub head 31 through the passage 42. A hard brush, such as a nylon brush, or a soft brush, such as a mohair brush, may be used as the brush 41. A cylindrical sponge with a passage formed at the center thereof may be used instead of the brush 41. The material forming the sponge may be PVA (polyvinyl alcohol) or PP (polypropylene).

Figure 6:
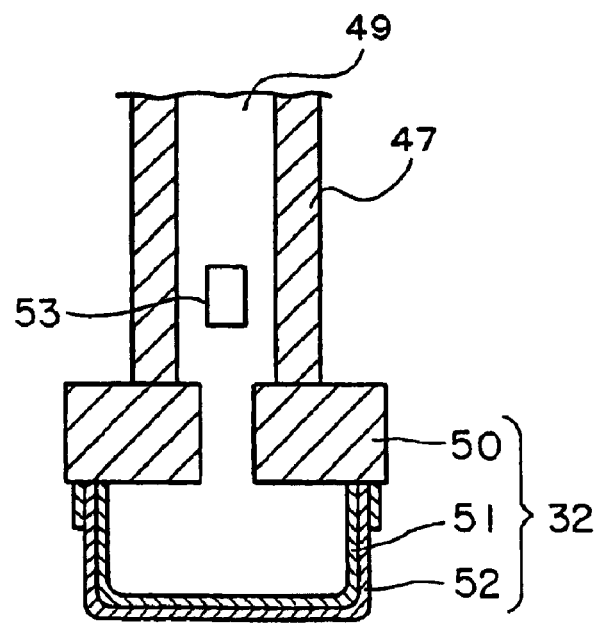
FIG. 6 is an enlarged cross sectional view of the second scrub head.

As shown in FIG. 6, the second scrub head 32 is consists of: a base 50; a hollow core 51 fixed to the base 50 and having an opening at the top thereof; and a cover 52 covering the entire surface of the core 51. The cover 52 is fixed to the surface of the 51 by thermowelding. The core 51 and the cover 52 are both made of material permeable to water. Thus, the cleaning liquid which has been fed to the second scrub head 32 from the cleaning liquid feeding passage 49 in the raising/descending shaft 47, is discharged from the entire surface of the cover 52. The material forming the cover may be a porous resin, such as fluoric resin or polyolefin.

Most preferably, a PTFE (polytetrafluoroethylene), having pores of 0.01 to several hundreds micrometer diameter, is used as the material forming the cover 52. A PTFE having hydrophilic property, which has been immersed in alcohol, or a PTFE having water-repellent property, which has been subjected to repellent treatment, may be used. Cleaning water can easily be passed through a PTFE having hydrophilic property. If contamination is adhered to the surface of such PTFE, the contamination can easily be washed away from the surface thereof. On the other hand, a PTFE having water-repellent property can repel contamination together with cleaning water, thereby preventing the contamination from adhering to the surface of the cover 52 without fail. In the event that polyolefin is used as the material of the cover 52, it is preferabdle to use a polyolefin having pores of several micrometer to several tens micrometer diameter and having been subjected to antistatics (prevention of static charge) treatment.

Upon comparison of the first and second scrub heads 31 and 32, the first scrub head 31 is superior to the second scrub head 32 in terms of the capability of removing a contamination adhering to a surface of the wafer W, and the second scrub head 32 has a lower level of adhesion to the contamination than that of the first scrub head 31. The differences in the characteristics between the first and second scrub heads 31 and 32 result from the differences in structure, material, the manner in which they are used (described below), etc.

The operation of the apparatus will be described. First, a carrier C containing twenty-five uncleaned (not-cleaned) wafers W is placed on the platform 2. The wafers W are removed, one by one, from the carrier C placed on the platform 2 by the loading/unloading arm 3. The wafer W thus removed is transferred from the loading/unloading arm 3 to the transfer arm 4. The wafer W is delivered to any one of the substrate cleaning apparatuses 7 thru 10 by the transfer arm 4, and is cleansed to remove contamination, such as particles. The cleaned wafer W is removed from the apparatuses 7 thru 10 by the transfer arm 4, is delivered to the loading/unloading arm 3, and is accommodated into the carrier C again.

Next, the cleaning process carried out by the substrate cleaning apparatus 7 is described. The spin chuck 22 holds the wafer W delivered by the transfer arm 4, and rotates the wafer W at 300 to 1500 rpm. The nozzle 60 is moved to a position above the wafer W, and feeds cleaning liquid, such as pure water, onto the wafer W, whereby a liquid film 61 is formed on the surface of the wafer W. The entire surface of the wafer W is cleansed while the first and second scrub heads 31 and 32 are travelling.

First, the first scrub head 31 is moved to a position above the center of the wafer W, and is moved downward so that the first scrub head 31 comes into contact with the center O of the wafer W. In such a case, as shown in FIG. 4, the first scrub head 31 may be lowered to a height where the bottom of the first scrub head 31 (i.e., the tip of the brush or the bottom surface of sponge) contacts with the wafer W.

Figure 7:
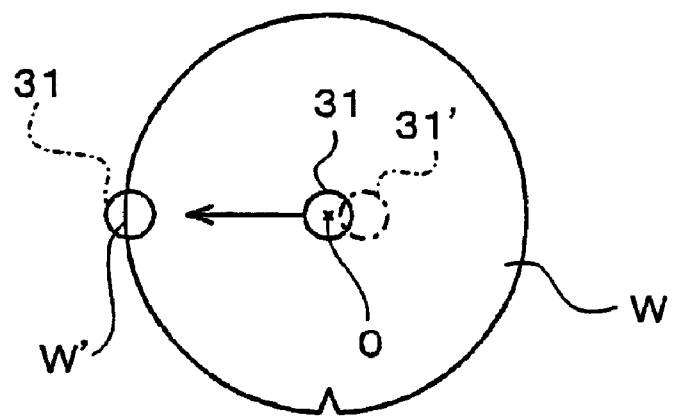
FIG. 7 is a top plan view illustrating the trajectory of the first scrub head.

Next, as shown in FIG. 7, the first scrub head 31 is moved from the center O of the W to the periphery W' of the wafer W. Since the wafer W is rotating, the entire surface of the wafer W is cleaned by moving the first scrub head 31 from the center O of the wafer W to the periphery W' of the wafer W. In such a case, as indicated by chain-dot lines in FIG. 7, the first scrub head 31 may be placed at a position past the center O of the W at the beginning, and then be moved to the periphery W' of the wafer W. Thereupon, the area in the vicinity of the center O of the wafer W can be cleaned without fail. Alternatively, the first scrub head 31 may placed on the periphery W' of the wafer W at the beginning, and then be moved to the center O of the wafer W. In addition, after the first scrub head 31 has been moved to the center O of the wafer W, the first scrub head 31 may moved to the periphery W of the wafer W again.

Upon cleansing of the entire surface of the wafer W by the first scrub head 31, contamination, such as particles, organic contaminants, or metallic impurities can be removed effectively. When cleaning the W by the first scrub head 31, the first scrub head 31 is rotated by the first driving device 36, and the cleaning liquid fed to the first scrub head 31 is discharged from the bottom of the first scrub head 31. Whereby, the contamination adhered to the surface of the W is removed effectively, and the removed contamination is washed away together with cleaning liquid from the surface of the wafer W.

The second scrub head 32 is moved to a position above the center C of the wafer W, and is lowered so that a small gap exists between the second scrub head 32 and the wafer W. In detail, as shown in FIG. 4, the second scrub head 32 is lowered so that the cover 52 of the second scrub head 32 contacts with the surface of the liquid film 61 formed on the wafer W but does not contact with the wafer surface itself.

Figure 8:
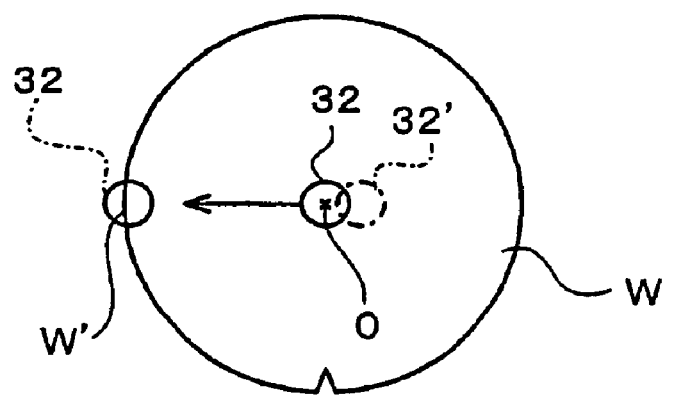
FIG. 8 is a top plan view illustrating the trajectory of the second scrub head.

Upon discharging the cleaning liquid from the entire surface of the cover 52, the second scrub head 32 is maintained under the condition that the head 32 floats on the liquid film and above the surface of the wafer W. Thereafter, as shown in FIG. 8, the second scrub head 32 is moved from the center O of the wafer W to the periphery W' of the wafer W, while the second scrub head 32 is maintained under the condition that the head 32 contacts with the surface of the liquid film 61 formed on the W but does not contact with the wafer surface itself. Since the W is rotated by the spin chuck 22, the entire surface of the wafer W can be cleaned upon moving the second scrub head 32 from the center O of the wafer W to the periphery W' of the wafer W. In such a case, as indicated by chain-dot line 32' in FIG. 8, the second scrub head 32 may be placed at a position past the center O of the wafer W at the beginning, and then be moved to the periphery W' of the wafer W. Thereupon, the area in the vicinity of the center O of the wafer W can be cleaned without fail.

By moving the second scrub head 32, relative to the wafer W, over the entire surface of the wafer W in the above-mentioned manner, contamination remaining on the wafer W can be removed. Since the second scrub head 32 has a lower level of adhesion to contamination than that of the first scrub head 31, when the surface of the wafer W is cleaned by the second scrub head 31, the removed contamination scarcely adheres to the second scrub head 32. Thus, the wafer W can be cleaned without the removed contamination being re-applied to the wafer surface.

When the entire surface of the wafer W is cleaned by the first and second scrub heads 31 and 32, the scrub heads 31 and 32 are preferably moved over the wafer surface so that the second scrub head 32 chases the first scrub head 31. Thereupon, the first scrub head 31 with a superior removing performance firstly removes contamination adhering to the wafer surface effectively, thereafter the second scrub head 32, with its low level of adhesion to contamination, further cleanses the wafer surface without re-applying removed contamination to the wafer surface.

Figure 10:
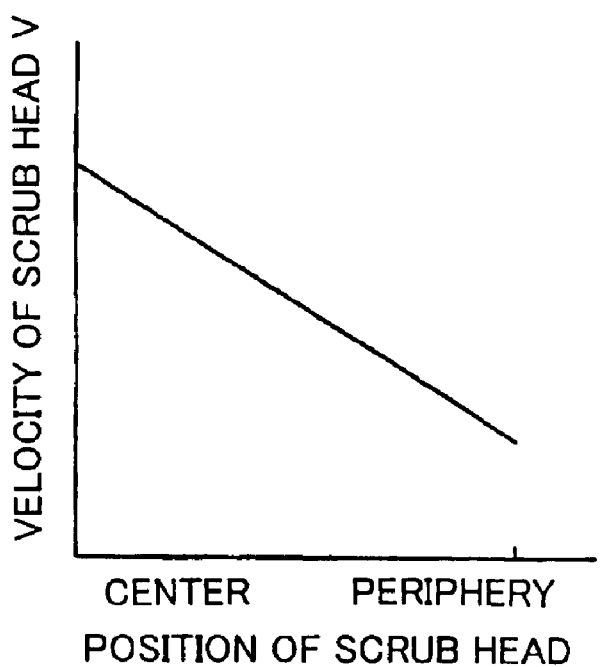
FIG. 10 is a graph showing the relationship between the velocity of the scrub head and the position of the scrub head.

In the event that the cleaning process is performed by moving the first and the second scrub heads 31 and 32 in a radial direction of the wafer W while the wafer W is rotating by the spin chuck 22, it is preferable that the velocities V of the first and second scrub heads 31 and 32 when they (31, 32) are positioned at the periphery W' of the wafer W be less than those when they (31, 32) are positioned at the center O of the wafer W, as shown in FIG. 10.

Figure 11:
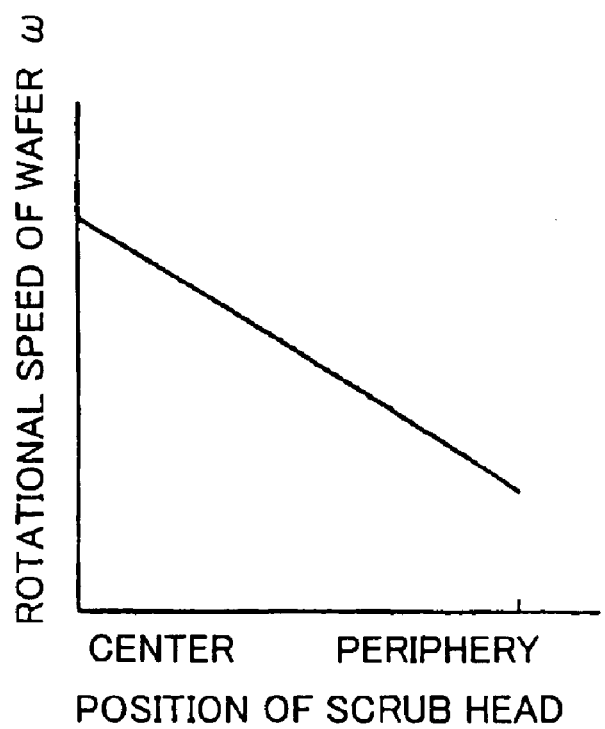
FIG. 11 is a graph showing the relationship between the rotational speed of the wafer and the position of the scrub head.

Alternatively, it is also preferable that the rotational speed ω of the wafer W when the first and second scrub heads 31 and 32 are positioned at the peripheral W' of the wafer W be less than that when they (31, 32) are positioned at the center O of the wafer W, as shown in FIG. 11. Accordingly, the wafer surface can be cleaned uniformly. The velocities V of the first and the second scrub heads 31 and 32 are controlled so that the cleaning period per unit area is constant. The rotational speed ω of the wafer W is controlled so that the velocities of the first and second scrub head 31 and 32 relative to the wafer W are kept to be constant, and affect the cleaning device (the heads) has on the wafer W thus remains constant.

A controller 30 is provided for controlling the velocities V of the scrub heads 31 and 32 and rotational speed ω of the spin chuck 22, according to the above.

After completing the cleansing by the first and second scrub heads 31 and 32, cleaning liquid, such as pure water, is discharged from the nozzle 60 to execute the rinse process. Thereafter, the rotational speed of the motor 21 is increased to rotate the wafer W at 1000 to 2000 rpm, or at a high rotational speed, to execute the spin-drying treatment in which the cleaning liquid is spin off of the wafer surface. After completion of the entire cleaning process, the cleaned wafer W is sent out from the substrate cleaning apparatus 7 by the transfer arm 4, is delivered to the loading/unloading arm 3, and is accommodated into the carrier C.

According to the cleaning system 1 (cleaning apparatus 7) of the present invention, the entire surface of the wafer W is cleaned effectively by use of two scrub heads 31 and 32. Thus, the wafer W can be cleaned effectively and in a short time period, even if the wafer W is a large-sized wafer of 300 mm diameter. In addition, the wafer W is cleaned by the first scrub head 31 and thereafter by the second scrub head 32. Thus, the first scrub head 31 can effectively remove contamination, such as particles, organic contaminants or metallic impurities, adhering to the wafer surface. Thereafter, the second scrub head 32 can subsequently clean the wafer surface without re-applying the removed contamination to the wafer surface. This results in the a reduction of load of the two scrub heads 31 and 32, thus the first and second scrub heads 31 and 32 can be used for a longer period, and the need for maintenance is reduced. In addition, since the cleaning period is shortened, the throughput of the cleaning apparatus is improved. Thus, the number of the substrate cleaning apparatuses arranged in one cleaning system can be reduced, resulting in a down-sizing of the cleaning system 1.

The substrate cleaning apparatus shown in FIGS. 2 and 3 may be modified as follows.

Figure 12:
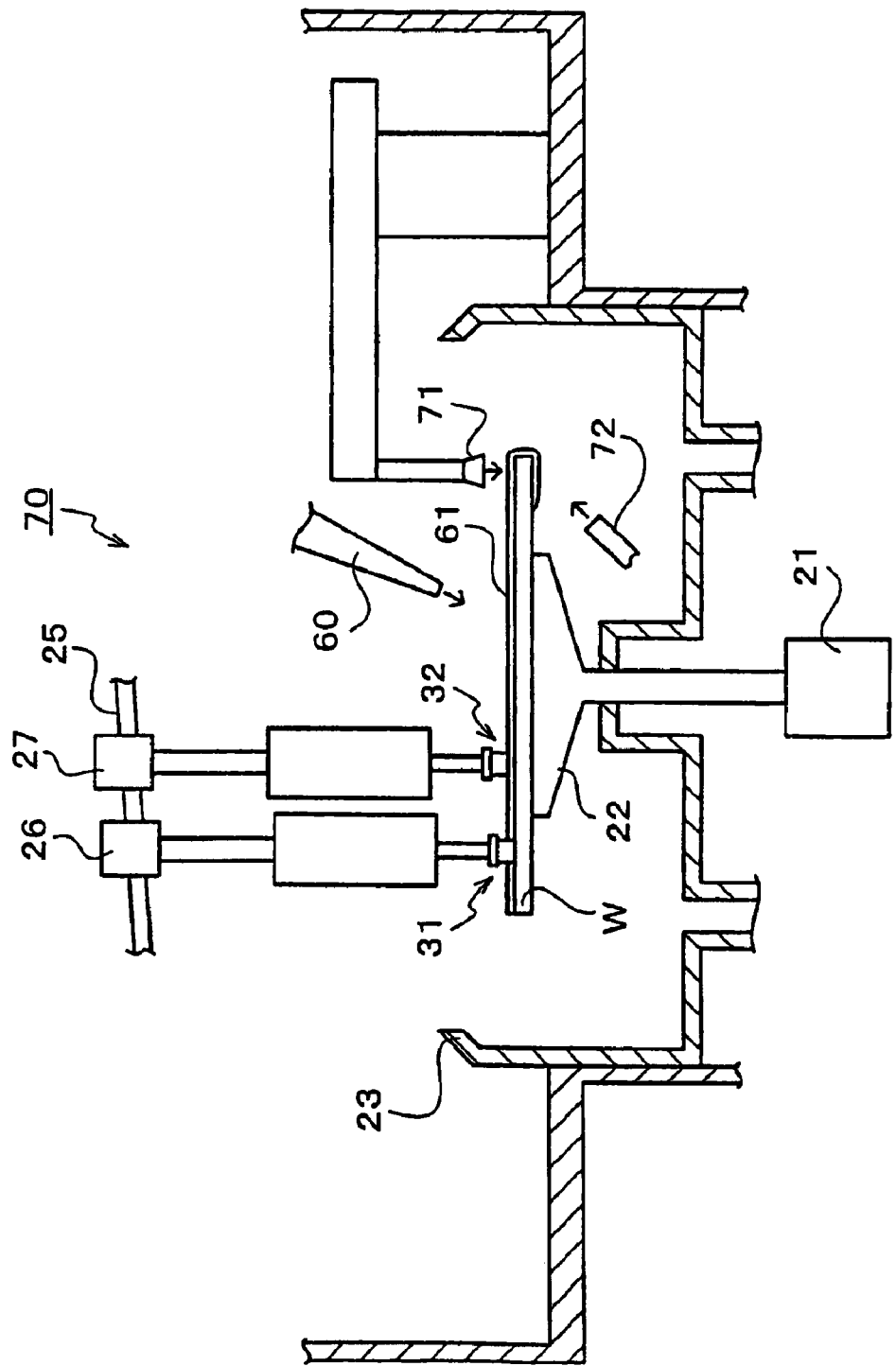
FIG. 12 is a cross-sectional view of a substrate cleaning apparatus, which is another embodiment of the present invention.

The substrate cleaning apparatus may be structured as shown in FIG. 12. A substrate cleaning apparatus 70 shown in FIG. 12 is different from the substrate cleaning apparatus 7 shown in FIGS. 2 and 3 only in that the apparatus 70 further includes: a megasonic nozzle 71 that feeds cleaning liquid, such as pure water, to which ultrasonic vibration is applied, onto the peripheral portion of the front surface of the wafer W; and a back surface cleaning nozzle 72 that feeds cleaning liquid, such as pure water, onto the back surface of the wafer W.

With the substrate cleaning apparatus 70 shown in FIG. 12, the megasonic nozzle 71 discharges cleaning liquid, to which ultrasonic vibration is applied, mainly towards the peripheral portion of the front surface of the wafer W. The back surface cleaning nozzle 72 discharges cleaning liquid mainly towards the peripheral portion of the back surface of the wafer W. The ultrasonic vibration applied to the cleaning liquid supplied to the front surface of the wafer W propagates to the back surface through the peripheral portion of the wafer W, whereby the ultrasonic vibration is applied to the cleaning liquid supplied to the peripheral portion of the back surface of the wafer W. Thus the back surface of the peripheral portion of the wafer W can also be cleaned effectively. In such a case, if the rotational speed of the wafer W is excessively high, only a small amount of cleaning liquid remains on the peripheral of the wafer W. Accordingly, the rotational speed of the W must be set to be an appropriate value, 300 to 1500 rpm, for example.

The substrate cleaning apparatus may also be structured as shown in FIG. 13. A substrate cleaning apparatus 75 shown in FIG. 13 is provided with only one arm 76 that moves along the guide rail 25. The first and second scrub heads 31 and 32 are attached in parallel to the bottom of the tip of the arm 76. The other portions of the apparatus are of the same structure as that of the substrate cleaning apparatus 7 shown in FIGS. 2 and 3. The use of only one common arm 76 results in simplicity of the structure and reduction of the manufacturing cost.

The substrate cleaning apparatus of FIGS. 2 and 3 may be modified so that it has two guide rails 25 and the first scrub head 31 and the second scrub head 32 is mounted to each of the guide rails.

Figure 9:
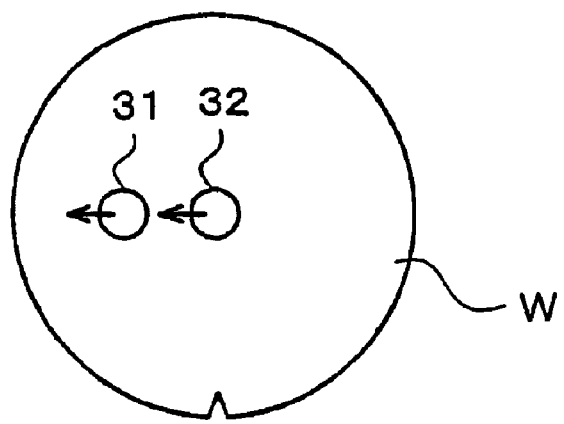
FIG. 9 is a top plan view illustrating the trajectory of the first and second scrub heads.

With the substrate cleaning apparatus of FIGS. 2 and 3, the first and second scrub heads 31 and 32 move linearly (in a radial direction of the wafer W) as shown in FIGS. 7 thru 9. However, the apparatus may be structured so that the first and second scrub heads 31 and 32 move curvilinearly. For example, an arm(s) capable of pivotal motion may be used instead of the first and second arms 26 and 27, shown in FIG. 2, capable of translational motion.

The number of the scrub heads is not limited to 2, and may be three or more.

The cleaning liquid is not limited to pure water, and may be: phosphoric acid solution; a mixed solution of phosphoric acid, acetic acid and nitric acid; APM solution (a mixed solution of ammonia, hydrogen peroxide water and pure water); HPM solution (a mixed solution of hydrochloric acid, hydrogen peroxide water and pure water); SPM solution (a mixed solution of nitric acid and hydrogen peroxide water); or the like.

The substrate to be cleaned is not limited to a wafer, and may be an LCD substrate, a CD substrate, a printed circuit board or a ceramic substrate.

What is claimed is:

1. A substrate cleaning apparatus comprising: a substrate holder that holds a substrate;
   a first scrub head that locates over the substrate, positions at a first height where the first scrub head substantially contacts the substrate during a cleaning operation, and moves, horizontally relative to the substrate; and
   a second scrub head that locates over the substrate together with the first scrub head, positions at a second height where the second scrub head contacts the substrate via a liquid film formed on the substrate, and moves horizontally relative to the substrate such the second scrub head follows the first scrub head.

2. The apparatus according to claim 1,
   wherein the first scrub head has a brush or sponge, which removes contamination from a surface of the substrate, and
   wherein the second scrub head has an internal space, into which a cleaning liquid is supplied, and a surface of the second scrub head is formed of a porous material having a plurality of pores through which the cleaning liquid supplied to the internal space is discharged.

3. A substrate cleaning apparatus comprising:
   a spin chuck that rotates a substrate about a rotation center while holding the substrate;
   a first scrub head that locates over the substrate held by the spin chuck, and moves horizontally relative to the substrate through the rotation center of the substrate toward a periphery of the substrate as it cleans the substrate; and
   a second scrub head that locates over the substrate together with the first scrub head, and moves horizontally relative to the substrate through the rotation center of the substrate toward a periphery of the substrate as it cleans the substrate such that the second scrub head follows the first scrub head, wherein the first scrub head is superior to the second scrub head in terms of a capability of removing contamination adhering to a surface of the substrate, and wherein the second scrub head has a lower level of adhesion to the contamination than that of the first scrub head.

4. The apparatus according to claim 3, further comprising:

a first head holder that holds the first scrub head at a height where the first scrub head substantially contacts with the substrate during the cleaning operation; and a second head holder that holds the second scrub head at a height where the second scrub head contacts with the substrate via a liquid film formed on the substrate during the cleaning operation.

5. The apparatus according to claim 3, wherein the first scrub head has a brush or sponge, which removes contamination from the surface of the substrate, and wherein the second scrub head has an internal space, into which a cleaning liquid is supplied, and a surface of the second scrub head is formed of a porous material having a plurality of pores through which the cleaning liquid supplied to the internal space is discharged.

6. The apparatus according to claim 3, further comprising:

a motor that rotates the substrate holder; and a head traveling mechanism that moves the first and second scrub heads linearly and horizontally.

7. The apparatus according to claim 6, wherein the head traveling mechanism includes a head holder that holds both the first and second scrub heads so that a horizontal distance between the first and second scrub heads is maintained constant.

8. The apparatus according to claim 6, wherein the head traveling mechanism includes:

a first head holder that holds the first scrub head;

a second head holder that holds the second scrub head; and a guide that guides the first and second head holders linearly and horizontally.

9. A substrate cleaning apparatus comprising:

a spin chuck that rotates a substrate about a rotation center while holding the substrate;

a first scrub head that locates over the substrate held by the spin chuck, and moves horizontally relative to the substrate through the rotation center of the substrate toward a periphery of the substrate as it cleans the substrate; and a second scrub head that locates over the substrate together with the first scrub head, and moves horizontally relative to the substrate through the rotation center of the substrate toward a periphery of the substrate as it cleans the substrate such that the second scrub head follows the first scrub head, wherein the first and second scrub heads are different at least in material or structure.

10. The apparatus according to claim 9, wherein the first scrub head has a brush or a sponge for removing contamination adhering to a surface of the substrate, and wherein the second scrub head has an internal space, into which a cleaning liquid is supplied, and a surface of the second scrub head is formed of a porous material having a plurality of pores through which the cleaning liquid supplied to the internal space is discharged.

11. The apparatus according to claim 9, wherein the first scrub head is superior to the second scrub head in terms of a capability of removing contamination adhering to a surface of the substrate, and wherein the second scrub head has a lower level of adhesion to the contamination than that of the first scrub head.

12. The apparatus according to claim 9 further comprising:

a motor that rotates the spin chuck;

a head traveling mechanism that moves the first and second scrub heads horizontally such that the second scrub head follows the first scrub head; and a controller that controls the motor and the head traveling mechanism, wherein the controller is configured to decrease a rotational speed of the substrate held by the spin chuck as the first and second scrub heads approach a periphery of the substrate.

13. The apparatus according to claim 9 further comprising:

a motor that rotates the spin chuck;

a head traveling mechanism that moves the first and second scrub heads in a radial direction of the substrate from about a center of the substrate; and a controller that controls the motor and the head traveling mechanism, wherein the controller is configured to decrease velocities of the first and second scrub heads as the first and second scrub heads approach a periphery of the substrate.

* * * * *